(12) United States Patent
Soneda et al.

(10) Patent No.: US 11,239,329 B2
(45) Date of Patent: Feb. 1, 2022

(54) SEMICONDUCTOR DEVICE

(71) Applicant: Mitsubishi Electric Corporation, Tokyo (JP)

(72) Inventors: Shinya Soneda, Tokyo (JP); Tetsuya Nitta, Tokyo (JP); Kenji Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/783,115

(22) Filed: Feb. 5, 2020

(65) Prior Publication Data

US 2021/0057529 A1 Feb. 25, 2021

(30) Foreign Application Priority Data

Aug. 23, 2019 (JP) .............................. JP2019-153085

(51) Int. Cl.
 *H01L 29/417* (2006.01)
 *H01L 29/45* (2006.01)
 (Continued)

(52) U.S. Cl.
 CPC ............ *H01L 29/417* (2013.01); *H01L 24/03* (2013.01); *H01L 24/05* (2013.01); *H01L 29/45* (2013.01);
 (Continued)

(58) Field of Classification Search
 CPC .................. H01L 29/66681–66704; H01L 29/7816–7826; H01L 29/41741; H01L 29/7393; H01L 29/861; H01L 23/562; H01L 2224/0501; H01L 2224/05013; H01L 2224/0555; H01L 2224/05553; H01L 2224/05557; H01L 29/417; H01L 29/45; H01L 24/03; H01L 24/05; H01L 2224/05166; H01L 29/1602; H01L 29/1608; H01L 29/2003;
 (Continued)

(56) References Cited

U.S. PATENT DOCUMENTS

| 8,492,891 B2 * | 7/2013 | Lu .......................... H01L 24/11 257/737 |
| 2010/0230811 A1 * | 9/2010 | Shin .................... H01L 23/3192 257/737 |

(Continued)

FOREIGN PATENT DOCUMENTS

JP 2017-050358 A 3/2017

*Primary Examiner* — Jonathan Han
(74) *Attorney, Agent, or Firm* — Studebaker & Brackett. PC

(57) ABSTRACT

According to an aspect of the present disclosure, a semiconductor device includes a semiconductor substrate, a lower electrode provided on the semiconductor substrate, an insulating film that is provided on the semiconductor substrate and surrounds the lower electrode and a metal film that is provided on the lower electrode and includes a convex portion on an upper surface thereof, wherein the convex portion includes a first portion extending in a first direction parallel to an upper surface of the semiconductor substrate, and a second portion extending in a second direction that is parallel to the upper surface of the semiconductor substrate and intersects the first direction, and the metal film is thinner than the insulating film.

23 Claims, 5 Drawing Sheets

(51) Int. Cl.
*H01L 23/00* (2006.01)
*H01L 29/16* (2006.01)
*H01L 29/20* (2006.01)

(52) U.S. Cl.
CPC ...... *H01L 29/1602* (2013.01); *H01L 29/1608* (2013.01); *H01L 29/2003* (2013.01); *H01L 2224/0218* (2013.01); *H01L 2224/04042* (2013.01); *H01L 2224/05017* (2013.01); *H01L 2224/05073* (2013.01); *H01L 2224/05082* (2013.01); *H01L 2224/05147* (2013.01); *H01L 2224/05155* (2013.01); *H01L 2224/05166* (2013.01); *H01L 2224/05186* (2013.01); *H01L 2224/05558* (2013.01); *H01L 2224/05686* (2013.01)

(58) Field of Classification Search
CPC . H01L 2224/04042; H01L 2224/05017; H01L 2224/0218; H01L 2224/05073; H01L 2224/05082; H01L 2224/05186; H01L 2224/05686; H01L 2224/05558; H01L 2224/05155; H01L 2224/05147
See application file for complete search history.

(56) References Cited

U.S. PATENT DOCUMENTS

| | | | |
|---|---|---|---|
| 2015/0061114 A1* | 3/2015 | Narita | H01L 24/06 257/734 |
| 2016/0027746 A1* | 1/2016 | Kramp | H01L 24/03 257/751 |
| 2017/0062340 A1* | 3/2017 | Ushijima | H01L 29/41741 |
| 2019/0067225 A1* | 2/2019 | Tonegawa | H01L 29/66727 |

* cited by examiner

SEMICONDUCTOR DEVICE

BACKGROUND OF THE INVENTION

Field

The present disclosure relates to a semiconductor device.

Background

JP 2017-050358 A discloses a semiconductor apparatus including a semiconductor substrate on which a semiconductor device is formed, and a first electrode layer that is provided on the semiconductor substrate and electrically connected to the semiconductor device. The semiconductor apparatus further includes a protective insulating film stacked on a part of the upper surface of the first electrode layer, and a second electrode layer stacked over both the first electrode layer and the protective insulating film. The material constituting the second electrode layer is higher in mechanical strength than the material constituting the first electrode layer. A groove portion is provided on the upper surface of the first electrode layer. In addition, a protruding portion that protrudes into the groove portion is provided on the lower surface of the second electrode layer.

It is considerable in the structure as shown in JP 2017-050358 A to form the second electrode layer by plating. In this case, plating solution may reach the semiconductor substrate at the groove portion, which causes the semiconductor substrate to be damaged.

SUMMARY

The present disclosure has been made to solve the above-described problem, and has an object to obtain a semiconductor device capable of realizing high reliability while suppressing damage to a semiconductor substrate due to plating.

The features and advantages of the present disclosure may be summarized as follows.

According to an aspect of the present disclosure, a semiconductor device includes a semiconductor substrate, a lower electrode provided on the semiconductor substrate, an insulating film that is provided on the semiconductor substrate and surrounds the lower electrode and a metal film that is provided on the lower electrode and includes a convex portion on an upper surface thereof, wherein the convex portion includes a first portion extending in a first direction parallel to an upper surface of the semiconductor substrate, and a second portion extending in a second direction that is parallel to the upper surface of the semiconductor substrate and intersects the first direction, and the metal film is thinner than the insulating film.

According to an aspect of the present disclosure, a semiconductor device includes a semiconductor substrate, a lower electrode provided on the semiconductor substrate, an insulating film that is provided on the semiconductor substrate, surrounds the lower electrode and forms an outer edge of a chip and a metal film that is provided on the lower electrode and includes a convex portion on an upper surface thereof, wherein the convex portion includes a first portion extending in a first direction parallel to an upper surface of the semiconductor substrate at an outer peripheral portion of the chip, and a second portion extending in a second direction that is parallel to the upper surface of the semiconductor substrate and intersects the first direction at an outer peripheral portion of the chip.

According to an aspect of the present disclosure, a semiconductor device includes a semiconductor substrate, a lower electrode provided on the semiconductor substrate, an insulating film that is provided on the semiconductor substrate and surrounds the lower electrode and a metal film that is provided on the lower electrode and includes a cross-shaped convex portion on an upper surface thereof.

Other and further objects, features and advantages of the disclosure will appear more fully from the following description.

DESCRIPTION OF EMBODIMENTS

Figure 1:
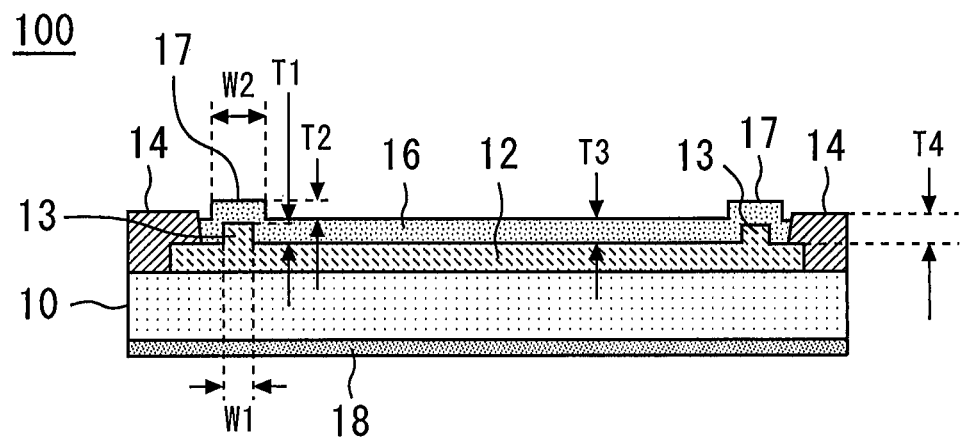
FIG. 1 is a cross-sectional view of a semiconductor device according to a first embodiment.

A semiconductor device according to an embodiment of the present disclosure will be described with reference to the accompanying drawings. Components identical or corresponding to each other are indicated by the same reference characters, and repeated description of them is avoided in some cases.

First Embodiment

FIG. 1 is a cross-sectional view of a semiconductor device 100 according to a first embodiment. The semiconductor device 100 includes a semiconductor substrate 10, a lower electrode 12, an insulating film 14, a plating electrode 16, and a back electrode 18. The semiconductor device 100 is, for example, a power semiconductor device. The power semiconductor device is, for example, a metal-oxide semiconductor field-effect transistor (MOSFET). The power semiconductor device may be an insulated gate bipolar transistor (IGBT) or a diode.

The lower electrode 12 is provided on the semiconductor substrate 10. The lower electrode 12 is provided as a pattern on the upper surface of the semiconductor substrate 10. The lower electrode 12 is an electrode for causing a main current to flow through the semiconductor device 100. The lower electrode 12 is, for example, a source electrode of MOSFET, an emitter electrode of IGBT, or an anode electrode of a diode. The lower electrode 12 is, for example, an Al alloy containing Al, Si, Cu, or the like. The thickness of the lower electrode 12 is, for example, 0.1 µm to 6 µm.

A protruding portion 13 is provided on the upper surface of the lower electrode 12. The protruding portion 13 is a part of the lower electrode 12. The protruding portion 13 is made of the same material as the lower electrode 12. The protruding portion 13 is provided by forming a part of the lower electrode 12 so that the part is thicker than the other part of the lower electrode 12. The height T1 of the protruding portion 13 ranges, for example, from 0.5 μm to 10 μm, and the width W1 ranges, for example, 0.5 μm to 100 μm.

The insulating film 14 is provided on the semiconductor substrate 10. The insulating film 14 covers an outer periphery of the semiconductor substrate 10. The insulating film 14 surrounds the lower electrode 12. A part of the insulating film 14 runs on the lower electrode 12. The insulating film 14 covers an end portion of the lower electrode 12. The insulating film 14 is a protective insulating film that protects the lower electrode 12 and the semiconductor substrate 10. The insulating film 14 is made of polyimide, for example.

The insulating film 14 has an opening portion at a center portion. A plating electrode 16 is provided in the opening portion by a plating technique. The plating electrode 16 is provided on the lower electrode 12. The entire plating electrode 16 is provided inside the insulating film 14. The plating electrode 16 is a metal film for solder joint, and, for example, a Ni—P film grown by electroless plating. The Ni—P film is a metal film containing several percentages of P. The plating electrode 16 may be formed from a material having higher mechanical strength than the lower electrode 12.

Generally, alloying of the metal film and the solder proceeds in a state where the metal film and the solder are joined to each other. This process may reduce the thickness of the metal film. Therefore, the plating electrode 16 is designed so that it does not disappear due to alloying under use conditions of the semiconductor device 100. As a result, the reliability of a solder joint portion can be secured. In particular, when the semiconductor device 100 is used under a severe heat stress environment, the plating electrode 16 is preferably designed to be thick to the extent that the plating electrode 16 does not disappear. In this case, it is preferable to form the plating electrode 16 by a plating technique rather than a sputtering technique. The thickness T3 of the plating electrode 16 ranges, for example, from 0.1 μm to 10 μm. Furthermore, the plating electrode 16 is not formed on the insulating film 14 and is thinner than the insulating film 14.

The plating electrode 16 has a convex portion 17 on the upper surface thereof. The plating electrode 16 covers the protruding portion 13 of the lower electrode 12. As a result, the shape of the protruding portion 13 is reflected on the surface of the plating electrode 16, and the convex portion 17 is formed on the plating electrode 16. Therefore, the convex portion 17 is provided at a position where the convex portion 17 overlaps the protruding portion 13 in plan view. The convex portion 17 is formed along the protruding portion 13 to be U-shaped in sectional view. The height T2 of the convex portion 17 ranges, for example, from 0.5 μm to 10 μm. The width W2 of the convex portion 17 is larger than the width W1 of the protruding portion 13, for example by 1 μm to 20 μm.

The thickness (T2+T3) of the plating electrode 16 at the convex portion 17 is larger than the thickness T3 of a flat portion of the plating electrode 16 other than the convex portion 17. For this reason, the convex portion 17 has higher mechanical rigidity in the vertical direction than the flat portion. The plating electrode 16 is thinner than the insulating film 14. In particular, the flat portion other than the convex portion 17 in the plating electrode 16 is thinner than a portion of the insulating film 14 which is provided on the lower electrode 12. In other words, T3<T4 is satisfied. If T3>T4 is satisfied, there would be a risk that the plating electrode 16 is formed thinly on the insulating film 14 as well. In this case, a portion of the plating electrode 16 which is located on the insulating film 14 has a thickness equal to the difference between T3 and T4. At this time, a portion which is low in rigidity is partially formed in the plating electrode 16. In the present embodiment, by setting T3<T4, it is possible to suppress formation of a portion having low rigidity in the plating electrode 16.

The back electrode 18 is provided on a back surface that is a surface opposite to the upper surface of the semiconductor substrate 10. The back electrode 18 is an electrode for causing a main current to flow through the semiconductor device 100. The back electrode 18 is, for example, a drain electrode of MOSFET, a collector electrode of IGBT, or a cathode electrode of a diode. The back electrode 18 is, for example, a stacked film containing Al, Ti, Ni, Au, Cu or the like. The thickness of the back electrode 18 ranges, for example, from 0.1 μm to 10 μm.

Figure 2:
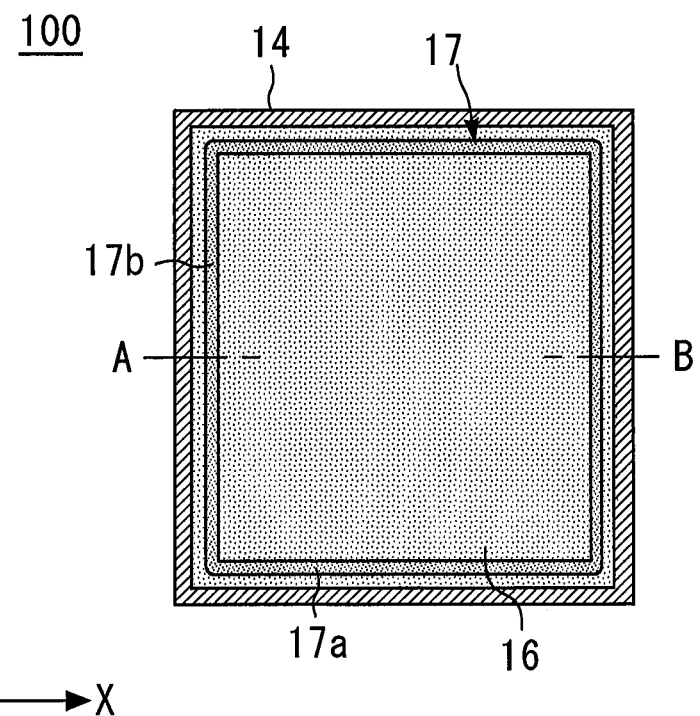
FIG. 2 is a plan view of the semiconductor device according to the first embodiment.

FIG. 2 is a plan view of the semiconductor device 100 according to the first embodiment. Note that FIG. 1 is obtained by cutting the semiconductor device 100 along a line A-B shown in FIG. 2. The semiconductor device 100 is quadrangular in plan view. The insulating film 14 forms an outer edge of a chip. The plating electrode 16 fills the opening portion of the insulating film 14. The plating electrode 16 is quadrangular in plan view. The convex portion 17 is provided at an outer peripheral portion of the plating electrode 16. The convex portion 17 extends along four sides of the plating electrode 16.

The convex portion 17 includes a first portion 17a extending in a first direction at the outer peripheral portion of the chip and a second portion 17b extending in a second direction at the outer peripheral portion of the chip. The first direction is a direction parallel to the upper surface of the semiconductor substrate 10. The first direction is an X-direction in FIG. 2. The second direction is a direction which is parallel to the upper surface of the semiconductor substrate 10 and intersects the first direction. The second direction is a Y-direction in FIG. 2.

Figure 3:
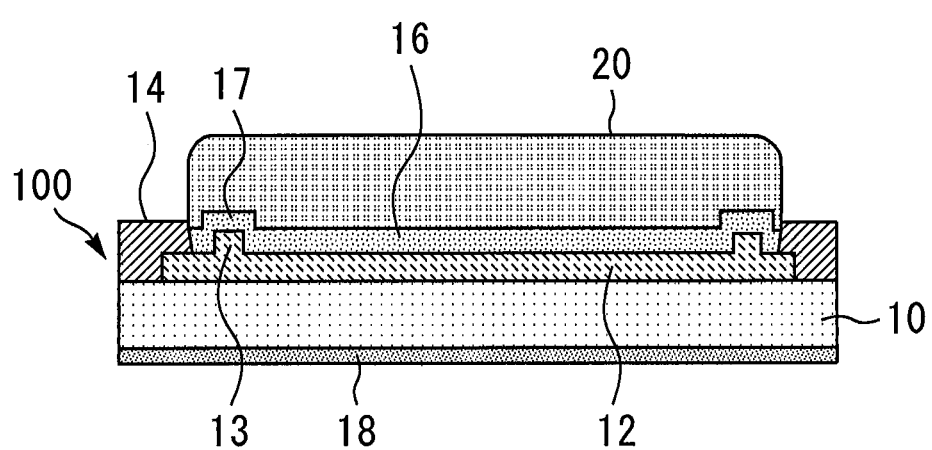
FIG. 3 is a cross-sectional view showing a state where solder is provided to the semiconductor device according to the first embodiment.

FIG. 3 is a cross-sectional view showing a state where solder 20 is provided to the semiconductor device 100 according to the first embodiment. The solder 20 is provided on the plating electrode 16. The solder 20 covers the plating electrode 16 as well as the convex portion 17. The solder 20 may cover the entire plating electrode 16. The solder 20 is provided on the inner side of the insulating film 14, and is not formed on the insulating film 14. An end portion of the solder 20 and an end portion of the plating electrode 16 are aligned with each other.

In the present embodiment, an external electrode and the electrode of the semiconductor device 100 are directly joined to each other by the solder 20. As a result, it is possible to make a large current flow while lowering the electrical resistance.

Next, an effect of the present embodiment will be described. Generally, a groove portion may be formed in the lower electrode in the structure in which the plating electrode is provided on the lower electrode. At this time, a portion having no lower electrode or a thin lower electrode is formed. When the plating electrode is formed in such a structure by the plating technique, there is a risk that the plating solution may reach the semiconductor substrate in the groove portion. As a result, the semiconductor substrate may be damaged, and the reliability of the semiconductor device may be impaired. In contrast, since the lower electrode 12 of the present embodiment has no groove portion, the present embodiment has an effect of suppressing damage to the semiconductor substrate 10 due to the plating processing.

By providing the convex portion 17 on the plating electrode 16, the mechanical strength in the vertical direction of the plating electrode 16 can be enhanced. In particular, the convex portion 17 is extended in the first direction and the second direction, whereby the convex portion 17 functions as a beam, which makes it possible to enhance the rigidity of the plating electrode 16. As a result, even when the plating electrode 16 is thinned, the strength of the plating electrode 16 can be secured against the stress in the vertical direction. In addition, since the mechanical strength of the semiconductor device 100 is enhanced by the convex portion 17, reliability of the semiconductor device 100 can be enhanced.

Figure 4:
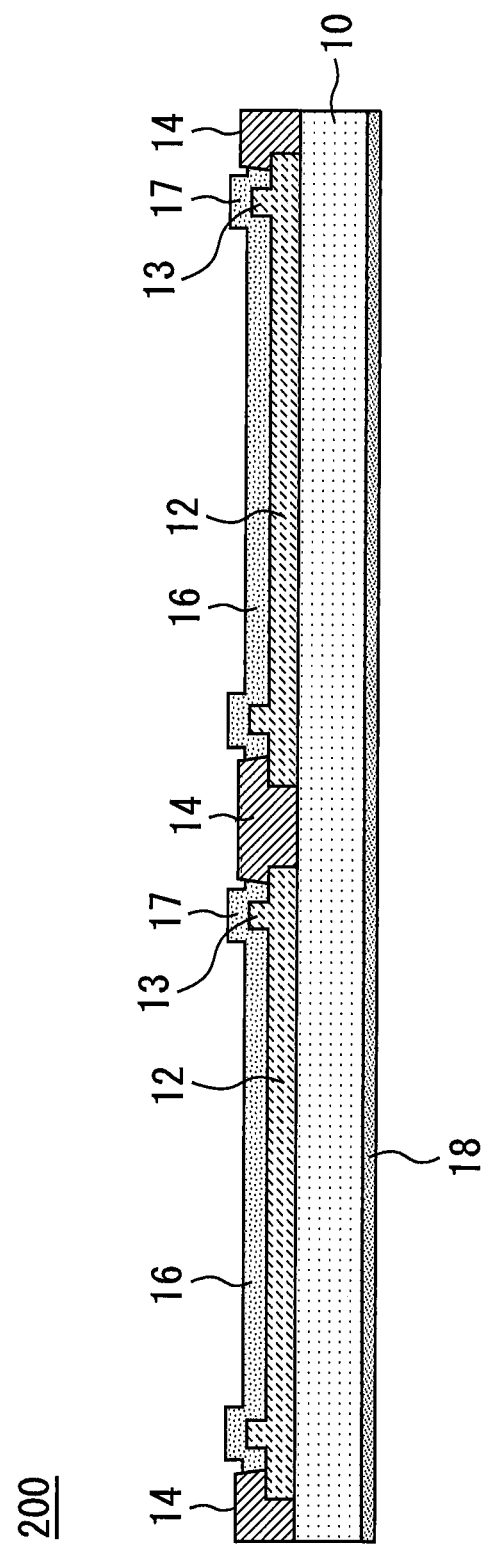
FIG. 4 is a cross-sectional view of a semiconductor device according to a first modification of the first embodiment.

FIG. 4 is a cross-sectional view of a semiconductor device 200 according to a first modification of the first embodiment. The lower electrode 12 and the plating electrode 16 may be divided into a plurality of portions. In FIG. 4, each of the lower electrode 12 and the plating electrode 16 is divided by an insulating film 14.

Figure 5:
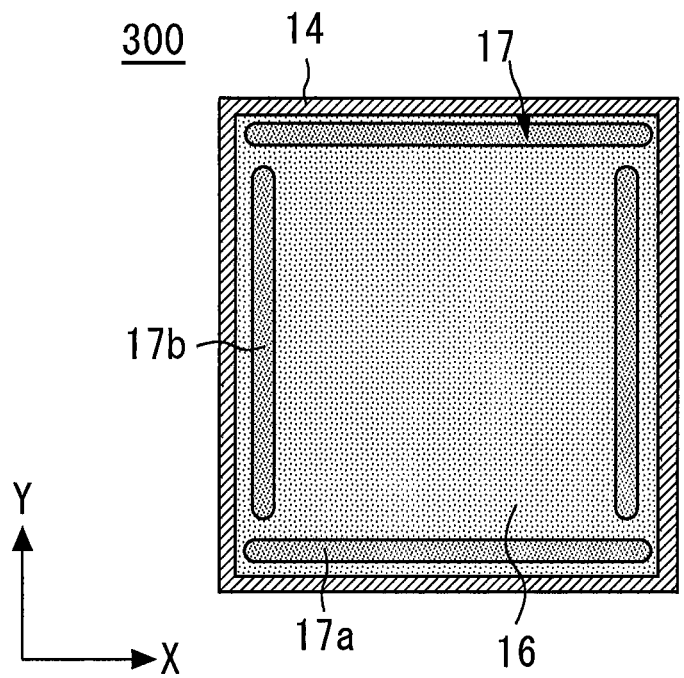
FIG. 5 is a plan view of a semiconductor device according to a second modification of the first embodiment.

FIG. 5 is a plan view of a semiconductor device 300 according to a second modification of the first embodiment. In the semiconductor device 300, the shape of the convex portion 17 is different from that of the semiconductor device 100. In the semiconductor device 300, a first portion 17a and a second portion 17b of the convex portion 17 are separated from each other. In this case, the same effect as that of the semiconductor device 100 can also be obtained.

Figure 6:
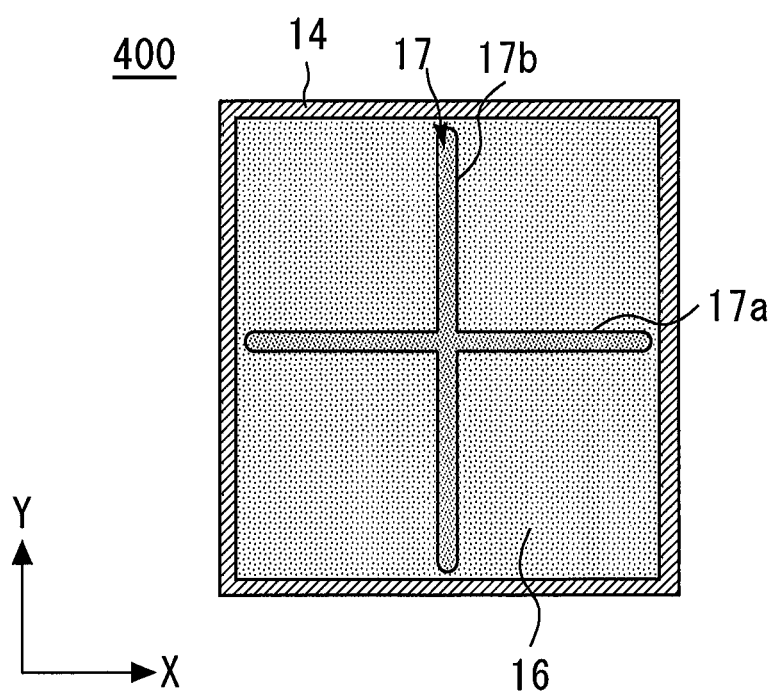
FIG. 6 is a plan view of a semiconductor device according to a third modification of the first embodiment.

FIG. 6 is a plan view of a semiconductor device 40Q according to a third modification of the first embodiment. In the semiconductor device 100, the convex portion 17 is provided at an outer peripheral portion of the plating electrode 16 along the insulating film 14. The arrangement of the convex portion 17 is not limited to this mode. As shown in FIG. 6, the convex portion 17 may be configured to have a cross shaped. In the semiconductor device 400, the first portion 17a and the second portion 17b intersect each other at a central portion of the chip.

In the semiconductor device 400, the central portion of the chip can be reinforced. Note that the mechanical strength of the plating electrode 16 against the stress in the vertical direction tends to be higher in a case where the convex portion 17 is positioned near an end portion of the plating electrode 16 as in the case of the semiconductor devices 100 and 300.

As described above, the convex portion 17 may have at least the first portion 17a extending in the first direction and the second portion 17b extending in the second direction intersecting the first direction. The first direction and the second direction may be inclined with respect to the sides of the chip. For example, the first portion 17a and the second portion 17b may extend along the diagonal lines of the chip.

The shapes of the chip, the insulating film 14 and the plating electrode 16 are not limited to those shown in FIG. 2, but may be, for example, a square, a rectangle, a polygon or the like.

In order to enhance the mechanical strength, it is preferable that the height T2 of the convex portion 17 is larger than a specified value. It is preferable that the height T2 of the convex portion 17 is 1 μm or more, for example.

In the present embodiment, the convex portion 17 may be formed on the plating electrode 16 by using unevenness of the protruding portion 13. Not limited to this, the protruding portion 13 is not necessarily provided as long as the convex portion 17 can be formed on the plating electrode 16. In this case, the same effect as that of the present embodiment can also be obtained. In this case, a flat lower electrode 12 is formed on the upper surface of the semiconductor substrate 10. Next, a flat metal film which is to serve as the plating electrode 16 is provided on the upper surface of the lower electrode 12 by plating or the like. Thereafter, the convex portion 17 may be formed by an additional processing step.

In the present embodiment, the plating electrode 16 is a metal film to be directly joined to an external electrode by the solder 20. However, the present embodiment is not limited to this mode, and the plating electrode 16 may be used as an electrode for wire bonding or Ag bonding. In this case, the same effect as that of the present embodiment can also be obtained.

As another modification of the present embodiment, the semiconductor substrate 10 may be made with a wide band gap semiconductor. The wide band gap semiconductor is, for example, silicon carbide, gallium-nitride-based material, or diamond. The semiconductor substrate 10 may be made with silicon.

These modifications can be appropriately applied to semiconductor devices according to embodiments below. Meanwhile, for the semiconductor devices according to the embodiments below, dissimilarities with the first embodiment will mainly be explained as they have many similarities with the first embodiment.

Second Embodiment

Figure 7:
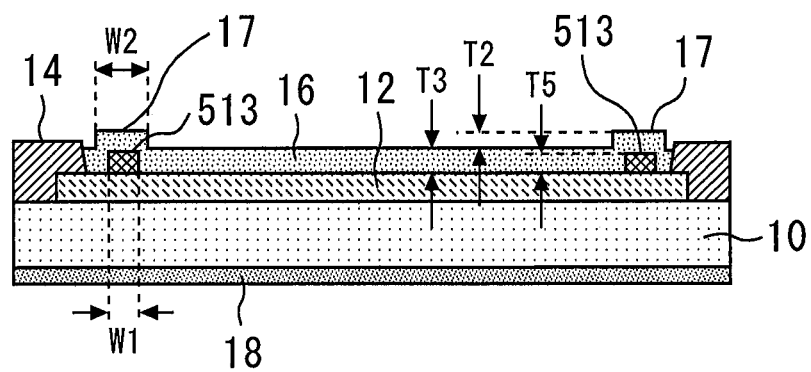
FIG. 7 is a cross-sectional view of a semiconductor device according to a second embodiment.

FIG. 7 is a cross-sectional view of a semiconductor device 500 according to a second embodiment. In the present embodiment, a protruding portion 513 is formed of a material different from that of the lower electrode 12. The convex portion 17 is formed on the plating electrode 16 by a step which is formed by the protruding portion 513. The protruding portion 513 may be formed of an insulating film or a non-insulating film. The insulating film is, for example, an oxide film, a silicon nitride film, or polyimide. The non-insulating film is formed of, for example, TiNi or Cu. Even in such a case, the same effect as that of the first embodiment can be obtained.

The width W1 of the protruding portion 513 is equal to or less than the double of the difference between the thickness T3 of the plating electrode 16 and the thickness T5 of the protruding portion 513. In general, plating grows on a specific material. The plating electrode 16 which is plating grows on the lower electrode 12. Furthermore, plating does not grow on the protruding portion 513 which is formed of a material different from that of the lower electrode 12.

Here, plating generally grows isotropically. Therefore, plating can be formed on the surface of the protruding portion 513 only within a certain range from the boundary between the lower electrode 12 and the protruding portion 513. Specifically, plating can also be formed on the surface of the protruding portion 513 by the thickness T3 of the plating electrode 16 from the boundary between the lower electrode 12 and the protruding portion 513.

Therefore, by setting the width W1 of the protruding portion 513 to not more than the double of the difference between the thickness T3 of the plating electrode 16 and the thickness T5 of the protruding portion 513, plating can be formed on the entire upper surface of the protruding portion 513. Therefore, even when the protruding portion 513 is formed of a material different from that of the lower electrode 12, the protruding portion 513 can also be covered with the plating electrode 16.

Third Embodiment

Figure 8:
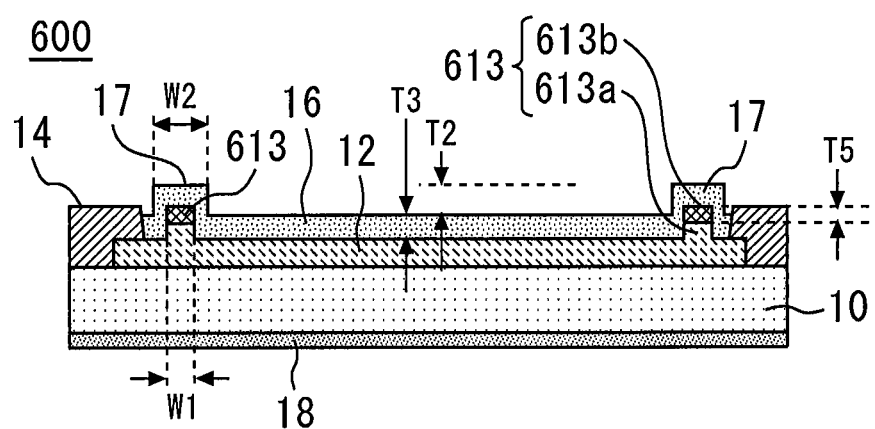
FIG. 8 is a cross-sectional view of a semiconductor device according to a third embodiment.

FIG. 8 is a cross-sectional view of a semiconductor device 600 according to a third embodiment. A protruding portion 613 includes a first protruding portion 613a and a second protruding portion 613b. The first protruding portion 613a is a part of the lower electrode 12, and is formed of the same material as that of the lower electrode 12. The second protruding portion 613b is provided on the first protruding portion 613a, and is formed of a material different from that of the lower electrode 12.

Next, a method for manufacturing the protruding portion 613 will be described. First, a metal film which is to serve as the lower electrode 12 is formed on the upper surface of the semiconductor substrate 10. Next, a mask layer which is to serve as the second protruding portion 613b is formed on the upper surface of the metal film. Next, the mask layer is patterned to form the second protruding portion 613b. Next, the metal film is etched along the second protruding portion 613b to form the lower electrode 12 and the first protruding portion 613a.

In general, as the convex portion 17 is higher, the mechanical strength in the vertical direction of the plating electrode 16 is more greatly enhanced. In the present embodiment, the plating electrode 16 is formed while the mask for forming the first protruding portion 613a is left. By combining the first protruding portion 613a and the second protruding portion 613b, the protruding portion 613 can be highly formed. As a result, the convex portion 17 can be highly formed. Therefore, the mechanical strength of the plating electrode 16 against the stress in the vertical direction can be enhanced while obtaining the effect of the first embodiment.

Furthermore, the mask for forming the first protruding portion 613a can be effectively used as the second protruding portion 613b. Note that in the first embodiment, the protruding portion 13 may be formed by removing the second protruding portion 613b after etching the metal film serving as the lower electrode 12.

Like the second embodiment, the width W1 of the second protruding portion 613b may be equal to or less than the double of the difference between the thickness T3 of the plating electrode 16 and the height T5 of the second protruding portion 613b. Accordingly, even when the second protruding portion 613b is formed of a material different from that of the lower electrode 12, the second protruding portion 613b can be covered with the plating electrode 16.

Meanwhile, technical features explained in each embodiment may be appropriately combined to use.

In the semiconductor device according to the present disclosure, no groove portion is provided in a lower electrode, so that it is possible to suppress a semiconductor substrate from being damaged due to plating. Furthermore, the mechanical strength of the semiconductor device is improved by a convex portion, so that high reliability of the semiconductor device can be realized.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2019-153085, filed on Aug. 23, 2019 including specification, claims, drawings and summary, on which the Convention priority of the present application is based, are incorporated herein by reference in its entirety.

The invention claimed is:

1. A semiconductor device comprising:
a semiconductor substrate;
a lower electrode provided on the semiconductor substrate;
an insulating film that is provided on the semiconductor substrate and surrounds the lower electrode; and
a metal film formed of Ni—P that is provided on the lower electrode and includes a convex portion on an upper surface thereof, wherein
the convex portion includes a first portion extending in a first direction parallel to an upper surface of the semiconductor substrate, and a second portion extending in a second direction that is parallel to the upper surface of the semiconductor substrate and intersects the first direction,
the metal film is thinner than the insulating film, and
the convex portion does not overlap with the insulating film in a plan view.

2. The semiconductor device according to claim 1, wherein
the convex portion is provided at an outer peripheral portion of the metal film along the insulating film.

3. The semiconductor device according to claim 1, wherein
the metal film is quadrangular in plan view, and
the convex portion extends along four sides of the metal film.

4. The semiconductor device according to claim 1, wherein
the convex portion is cross-shaped.

5. The semiconductor device according to claim 1, wherein
the insulating film has a portion provided on the lower electrode, and
the metal film is thinner than the portion of the insulating film provided on the lower electrode.

6. The semiconductor device according to claim 1, wherein
the metal film is wholly provided inside the insulating film.

7. The semiconductor device according to claim 1, wherein
a protruding portion is provided on an upper surface of the lower electrode at a position where the protruding portion overlaps the convex portion in plan view.

8. The semiconductor device according to claim 7, wherein
the protruding portion is a part of the lower electrode.

9. The semiconductor device according to claim 7, wherein
the protruding portion is formed of a material different from that of the lower electrode.

10. The semiconductor device according to claim 9, wherein
a width of the protruding portion is equal to or less than double of a difference between a thickness of the metal film and a height of the protruding portion.

11. The semiconductor device according to claim 7, wherein
the protruding portion includes a first protruding portion that is a part of the lower electrode, and a second protruding portion that is provided on the first protruding portion and is formed of a material different from that of the lower electrode.

12. The semiconductor device according to claim 11, wherein
a width of the second protruding portion is equal to or less than double of a difference between a thickness of the metal film and a height of the second protruding portion.

13. The semiconductor device according to claim 1, wherein
the semiconductor substrate is made with a wide band gap semiconductor.

14. The semiconductor device according to claim 13, wherein
the wide band gap semiconductor is silicon carbide, gallium-nitride-based material or diamond.

15. The semiconductor device according to claim 1, wherein
the metal film has a height that is less than a height of the insulating film so that the insulating film surrounds the metal film.

16. The semiconductor device according to claim 1, wherein
no part of the metal film is provided on a top surface of the insulating film.

17. A semiconductor device comprising:
a semiconductor substrate;
a lower electrode provided on the semiconductor substrate;
an insulating film that is provided on the semiconductor substrate, surrounds the lower electrode and forms an outer edge of a chip; and
a metal film formed of Ni—P that is provided on the lower electrode and includes a convex portion on an upper surface thereof, wherein
the convex portion includes a first portion extending in a first direction parallel to an upper surface of the semiconductor substrate at an outer peripheral portion of the chip, and a second portion extending in a second direction that is parallel to the upper surface of the semiconductor substrate and intersects the first direction at an outer peripheral portion of the chip, and
the convex portion does not overlap with the insulating film in a plan view.

18. The semiconductor device according to claim 17, wherein
the metal film is thinner than the insulating film.

19. The semiconductor device according to claim 17, wherein
the metal film has a height that is less than a height of the insulating film so that the insulating film surrounds the metal film.

20. The semiconductor device according to claim 17, wherein
no part of the metal film is provided on a top surface of the insulating film.

21. A semiconductor device comprising:
a semiconductor substrate;
a lower electrode provided on the semiconductor substrate;
an insulating film that is provided on the semiconductor substrate and surrounds the lower electrode; and
a metal film formed of Ni—P that is provided on the lower electrode and includes a cross-shaped convex portion on an upper surface thereof, wherein
the convex portion does not overlap with the insulating film in a plan view.

22. The semiconductor device according to claim 21, wherein
the metal film has a height that is less than a height of the insulating film so that the insulating film surrounds the metal film.

23. The semiconductor device according to claim 21, wherein
no part of the metal film is provided on a top surface of the insulating film.

* * * * *